United States Patent
Cheng et al.

(10) Patent No.: US 11,283,238 B2
(45) Date of Patent: Mar. 22, 2022

(54) CHARGED POLARON-POLARITONS IN AN ORGANIC SEMICONDUCTOR MICROCAVITY

(71) Applicant: The Penn State Research Foundation, University Park, PA (US)

(72) Inventors: Chiao-Yu Cheng, State College, PA (US); Noel C. Giebink, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 137 days.

(21) Appl. No.: 16/762,541

(22) PCT Filed: Nov. 14, 2018

(86) PCT No.: PCT/US2018/061033
§ 371 (c)(1),
(2) Date: May 8, 2020

(87) PCT Pub. No.: WO2019/099506
PCT Pub. Date: May 23, 2019

(65) Prior Publication Data
US 2021/0376568 A1  Dec. 2, 2021

Related U.S. Application Data

(60) Provisional application No. 62/585,903, filed on Nov. 14, 2017.

(51) Int. Cl.
*H01S 3/08* (2006.01)
*H01S 5/10* (2021.01)
(Continued)

(52) U.S. Cl.
CPC .......... *H01S 5/1042* (2013.01); *H01S 5/0422* (2013.01); *H01S 5/18369* (2013.01);
(Continued)

(58) Field of Classification Search
CPC .. H01S 5/1042; H01S 5/0422; H01S 5/18369; H01S 5/36; H01S 5/305
See application file for complete search history.

(56) References Cited

U.S. PATENT DOCUMENTS

| | | | |
|---|---|---|---|
| 7,889,774 B2 * | 2/2011 | Forrest | H01S 3/168 372/53 |
| 8,748,219 B2 * | 6/2014 | Tischler | H01S 3/0627 438/99 |

(Continued)

OTHER PUBLICATIONS

Cheng et al., "Charged Polaron Polaritons in an Organic Semiconductor Microcavity." Physical review letters. Jan. 3, 2018;120(1):017402, entire document [on line] URL <https://(journals.aps.org/pr1/abstract/10.1103/PhysRevLett.120.017 402>.

(Continued)

*Primary Examiner* — Kinam Park
(74) *Attorney, Agent, or Firm* — Dinsmore & Shohl LLP

(57) ABSTRACT

A method of generating a light-matter hybrid species of charged polaritons at room temperature includes providing an organic semiconductor microcavity being a doped organic semiconductor sandwiched in a microcavity capable of generating an optical resonance and coupling light to the polaron optical transition in the organic semiconductor microcavity thereby forming polaron-polaritons. The doped organic semiconductor may be a hole/electron transport material having a polaron absorption coefficient exceeding $10^2$ cm$^{-1}$ and capable of generating a polaron optical transition with a linewidth smaller than a predetermined threshold. The optical resonance of the microcavity has a resonance frequency matched with the polaron optical transition.

20 Claims, 12 Drawing Sheets

(51) Int. Cl.
*H01S 5/36* (2006.01)
*H01S 5/183* (2006.01)
*H01S 5/042* (2006.01)
*H01S 5/30* (2006.01)
*H01L 51/00* (2006.01)

(52) U.S. Cl.
CPC ............... *H01S 5/305* (2013.01); *H01S 5/36* (2013.01); *H01L 51/002* (2013.01)

(56) References Cited

U.S. PATENT DOCUMENTS

| | | | |
|---|---|---|---|
| 2002/0008233 A1 | 1/2002 | Forrest et al. | |
| 2005/0195873 A1* | 9/2005 | Forrest | H01S 5/36 372/39 |
| 2006/0133437 A1* | 6/2006 | Forrest | H01S 5/36 372/39 |
| 2010/0301307 A1* | 12/2010 | Fattal | H01L 33/46 257/13 |
| 2010/0307553 A1* | 12/2010 | Defries | B82Y 20/00 136/243 |
| 2011/0261851 A1* | 10/2011 | Malpuech | H01S 5/34333 372/45.01 |
| 2012/0213670 A1 | 8/2012 | Melpignano | |
| 2015/0162560 A1* | 6/2015 | Chen | H01L 51/5221 257/40 |
| 2017/0199036 A1 | 7/2017 | Moxley, III | |

OTHER PUBLICATIONS

Holmes et al., "Strong exciton-photon coupling in organic materials." Organic Electronics vol. 8, Issues 2-3, Apr.-Jun. 2007, pp. 77-93, abstract; p. 85, col. 2 [online] URL <https://www.sciencedirect.com/science/article/pii/S1566119906000887>.

Flatten et al., "Electrically tunable organic-inorganic hybrid polaritons with monolayer WS2." Nature communications. Jan. 17, 2017;8:14097, abstract [online] URL <https://www.nature.com/articles/ncomms14097 .pdf>.

Agranovich et al. Hybrid Frenkel-Wannier-Mott excitons at interfaces and in microcavities.Optical Materials 9.1-4 (1998): 430-436, entire document [online] URL <https://www.sciencedirect.com/science/article/pii/S0925346797000724>.

Revets et al; Polaron-Polaritons in teh Integer and Fractinal Quantum Hall Regimes; Institute of QuantumElectroncis; CH-8093.

International Search Report dated Mar. 20, 2019; International Application No. PCT/US2018/061033.

* cited by examiner

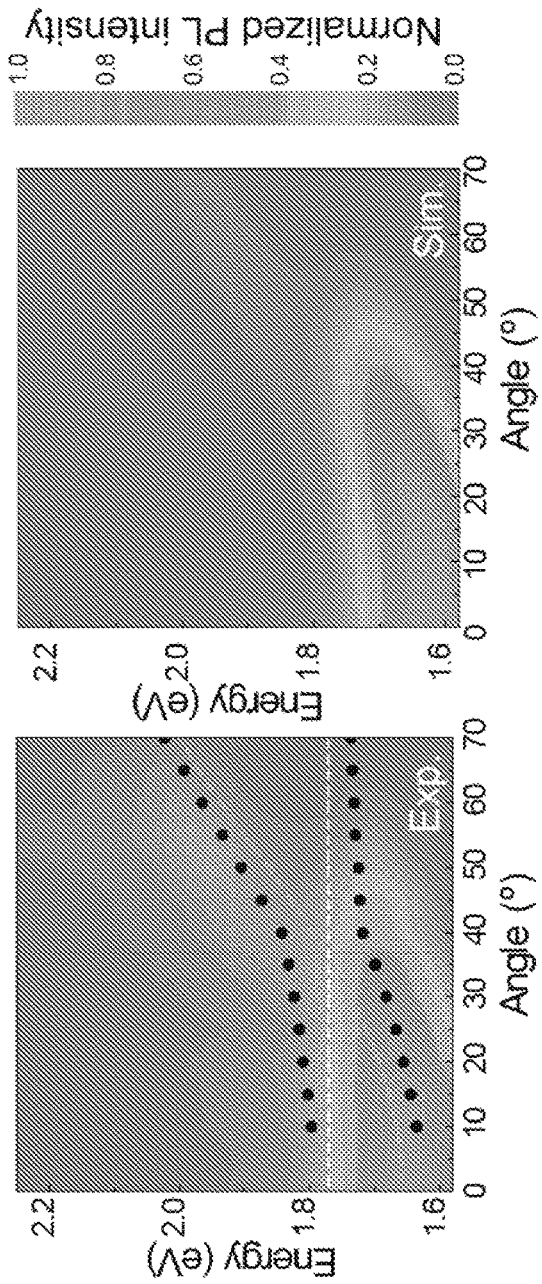
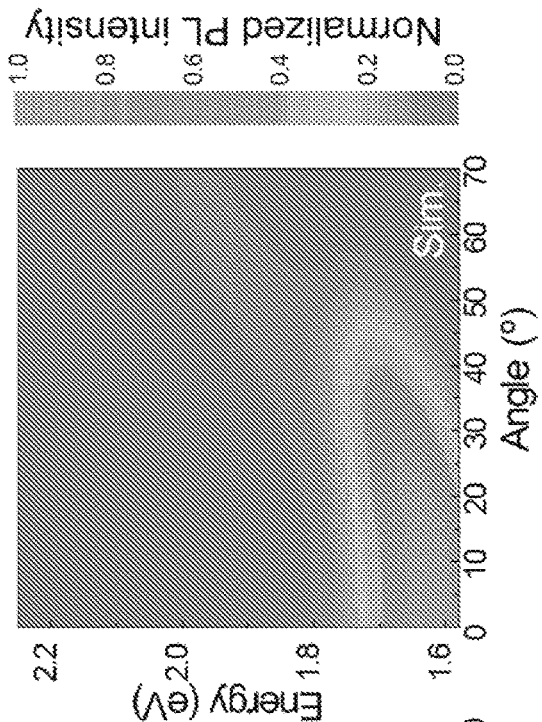
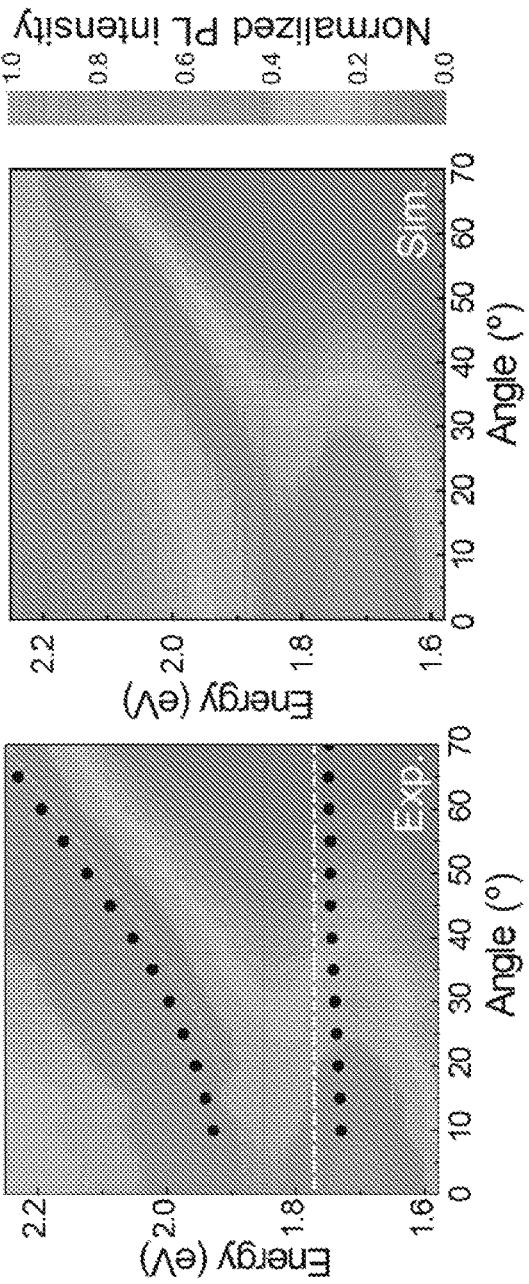
FIG. 5A  FIG. 5B  FIG. 5C  FIG. 5D

CHARGED POLARON-POLARITONS IN AN ORGANIC SEMICONDUCTOR MICROCAVITY

CROSS REFERENCE TO RELATED APPLICATIONS

This application is the U.S. National Stage of PCT/US2018/061033 filed Nov. 14, 2018, which claims priority to U.S. Provisional Patent Application Ser. No. 62/585,903, filed Nov. 14, 2017, the entire content of both are incorporated herein by reference.

GOVERNMENT SPONSORSHIP

This invention was made with government support under Grant No. DMR1654077 awarded by the National Science Foundation. The Government has certain rights in the invention.

FIELD OF THE INVENTION

The present invention generally relates to a new species of charged polaritons in an organic semiconductor at room temperature, in particular, polaron-polaritons.

BACKGROUND OF THE INVENTION

Exciton-photon polaritons that emerge in the strong light-matter coupling regime have been studied extensively using a variety of organic and inorganic semiconductors.[1,2] Strong excitonic transitions typically provide the matter resonance whereas a variety of different optical modes (such as, e.g. Fabry-Perot,[1,2] photonic crystal defect,[3] and surface plasmon modes[4]) can be used for the photonic resonance. Being comprised of charge neutral excitons and photons, the resulting polaritons are also spin-1 bosons that carry no charge and therefore their motion cannot be manipulated directly with applied electric fields, except for relatively weak instances when polaritons carry a static dipole moment inherited from a spatially-indirect exciton transition.[5,6]

The possibility of strong coupling to a charged semiconductor excitation was initially demonstrated for trions (i.e. a complex consisting of an exciton bound to a free electron or hole) in CdTe and GaAs quantum wells.[7,8] Owing to their net charge, the resulting trion polaritons are expected to possess some unusual properties, such as a very large charge-to-mass ratio, the ability to control their motion with an electric field, and a vacuum Rabi splitting that depends on the square root of the electron density in the quantum well.[9] This species nonetheless remains challenging to study and even more difficult to exploit for practical applications because their low binding energy (~1 meV) demands operation at liquid He temperature and invariably leads to an admixture with the neutral exciton polariton.[8,9]

SUMMARY OF THE INVENTION

The present invention provides a method of generating a light-matter hybrid species by generating strong coupling between light and polaron optical excitations in a doped organic semiconductor microcavity at room temperature.

The organic semiconductor microcavity may be a doped organic semiconductor sandwiched in a microcavity. The doped organic semiconductor microcavity can be said to have a polaron-polariton mode. When a light beam is directed into the organic semiconductor microcavity at an incidence angle and reflected by the microcavity, the optical polaron transition of the heavily doped organic semiconductor will couple with the reflected light and form the polaron-polaritons when the frequency of the reflected light matches with the frequency of the hybridized polaron-polariton resonance, meaning the frequencies or the associated photon energies are substantially equal or the difference is within 20%. The polaron-polaritons are charge-carrying polaritons.

For the purpose of the present application, the term "organic semiconductor microcavity" and "doped organic semiconductor microcavity" refer to the same structure and therefore can be used interchangeably.

The doped organic semiconductor may be a hole/electron transport material having a polaron absorption coefficient exceeding $10^2$ cm$^{-1}$ and capable of generating a polaron optical transition with a linewidth smaller than a predetermined threshold. The hole/electron transport material has a binding energy high enough such that the polaron optical transition is observed at room temperature.

In one embodiment, the organic semiconductor may be the hole transport material 4,4'-cyclohexylidenebis[N,N-bis(4-methylphenyl)benzenamine](TAPC). Co-depositing metal oxides such as $MoO_3$ and the TAPC introduces a large hole density with a sufficiently narrow linewidth optical transition<0.4 eV that is sufficient to resolve Rabi splittings in excess of 0.3 eV at room temperature. The acceptable linewidth of the polaron transition in general needs to be less than twice the Rabi splitting, which in turn depends on the magnitude of the polaron absorption coefficient. Examples of other materials that could be used are small molecule organic semiconductors such as the linear polyacenes, rubrene, perylene, N,N'-Bis(3-methylphenyl)-N,N'-diphenylbenzidine (TPD), and many others. Additionally, conjugated polymer organic semiconductors such as poly(p-phenylene vinylene), polyfluorene, and many others could also be used. In one embodiment, the optical transition may be centered at 1.8 eV and a hole absorption coefficient of exceeding $10^4$ cm$^{-1}$ may be achieved. In general, materials with polaron absorption coefficients exceeding $10^2$ cm$^{-1}$ are required to form polaron polaritons.

Coupling this transition to a microcavity mode yields upper and lower polaron polariton branches that are clearly resolved in angle-dependent reflectivity with a vacuum Rabi splitting $\hbar\Omega_R > 0.3$ eV. The resulting polaron polaritons may offer a path to electrically control polaritons in organic semiconductors and may lead to increased polariton-polariton Coulombic interactions that lower the threshold for nonlinear phenomena such as polariton condensation and lasing.

The microcavity may be a Fabry-Perot cavity, dielectric mirrors, cylindrical cavity or the like. The cavity can be as simple as a pair of glass substrates with a layer of silver coating on the substrate. The microcavity may be semi-transparent. A cavity is said to be a microcavity if the cavity is on the order of magnitude of a wavelength of light.

To introduce positive polarons, doping with other metal oxides such as WO3 would work, as would molecular dopants such as F4-TCNQ (2,3,5,6-Tetrafluoro-7,7,8,8-tetracyanoquinodimethane). To introduce negative polarons, doping with alkali metals such as Li or molecules such as $Rb_2CO_3$ would work.

The step of fabricating an organic semiconductor microcavity may include p-doping the organic semiconductor by co-evaporating the organic semiconductor with a concentration of dopants including metals, metal oxides, or molecular dopants.

In one embodiment, the step of fabricating the organic semiconductor microcavity includes p-doping the TAPC by co-evaporating the TAPC with a concentration of $MoO_3$ forming a $MoO_3$:TAPC film, the $MoO_3$:TAPC film sandwiched between the microcavity according to a structure: glass substrate/Ag (100 nm)/$MoO_3$:TAPC/Ag (17 nm). The $TAPC^+$ polaron density in 30 wt % $MoO_3$ doped organic semiconductor film is of an order of $10^{20}$ $cm^{-3}$. The thickness of $MoO_3$:TAPC film ranges from 175 nm for 10 wt % $MoO_3$ to 155 nm for 30 wt % $MoO_3$.

A doped organic semiconductor microcavity in accordance with the present invention may be used to control the direction of a light beam. The organic semiconductor microcavity has a polaron-polariton mode and may include two electric contacts. Applying an electric field between the two electric contacts generating an electric field between the two electric contacts causing a drift of the polarons. When a light beam having a wavelength or a wavelength range is directed at an incident angle into the doped organic semiconductor microcavity, the light will be coupled into the polaron-polariton mode and may be accelerated by the field, gaining an additional in-plane momentum component from the drift of the polarons that results in an angular deviation of the reflected light beam. The direction of the reflected light may be controlled by controlling magnitude and direction of the current.

A doped organic semiconductor microcavity of the present invention may also give rise to photogenerated electric currents. The organic semiconductor microcavity may have two electric contacts for measurement. When a light beam is directed at an incident angle into the organic semiconductor microcavity, an electric current is generated flowing between the two contacts. A light beam normal to the surface of the organic semiconductor microcavity would not yield any current in this case.

If the microcavity is wedged with a thickness of the active layer varies from one side to the other, a polariton-voltaic device may be created. Creating a wedged cavity would induce acceleration of polaron polaritons due to the potential gradient from the cavity mode and would lead to a photovoltage (V) detected between the two electrodes.

In an alternative embodiment, polaron polaritons may be created electrostatically by using an organic thin film transistor architecture with a metal gate that supports a surface plasmon mode or other tightly confined optical modes. Applying negative/positive gate voltage will accumulate a large hole/electron density in the channel of the device. The resulting density of positively charged $TAPC^+$ molecules may have an interaction with the surface plasmon mode (SPP) supported by the gate electrode or another similar confined mode that is substantial enough to create hybrid charged polariton modes. In one embodiment, the organic material may be TAPC. Other small molecule organic semiconductors may be used.

BRIEF DESCRIPTION OF THE DRAWINGS

FIG. 5A is a false color map of the angle-resolved, s-polarized photoluminescence intensity collected from a negatively-detuned cavity ($\Delta=-0.11$ eV) under non-resonant, $\lambda=375$ nm excitation;

FIG. 5B a positively-detuned cavity ($\Delta=+0.11$ eV) under non-resonant, $\lambda=375$ nm excitation;

FIG. 5C is a simulated map showing the s-polarized photoluminescence intensity simulated for the negatively-detuned cavity via transfer matrix dipole emission modeling;

FIG. 5D is a simulated map showing the s-polarized photoluminescence intensity simulated for the positively-detuned cavity via transfer matrix dipole emission modeling;

DETAILED DESCRIPTION OF THE INVENTION

Overview

Figure 1A:
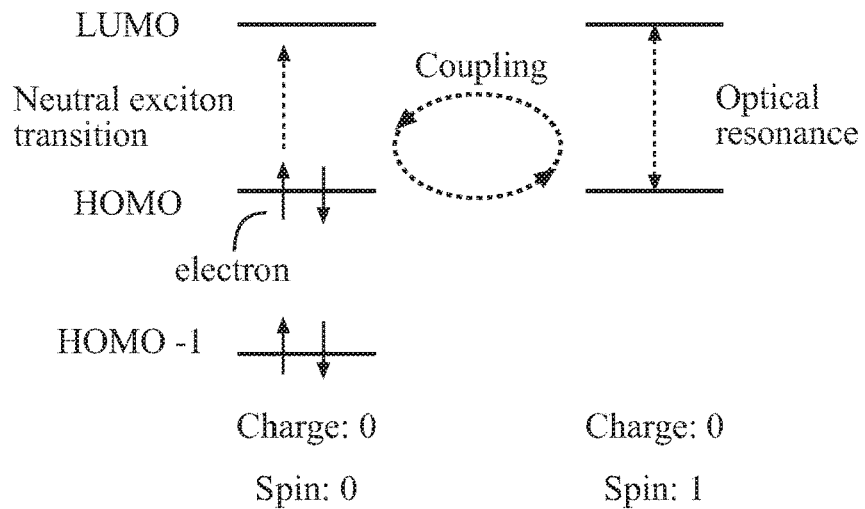
FIG. 1A is a schematic showing a traditional organic semiconductor exciton polariton.

The present invention demonstrates strong coupling between light and charge-carrying polaron optical excitations in an organic semiconductor at room temperature. A radical cation transition of hole-doped 4,4'-cyclohexylidenebis[N,N-bis(4-methylphenyl)benzenamine](TAPC) can be strongly coupled to the optical field in a planar microcavity to yield polaron polariton states with a vacuum Rabi splitting >0.3 eV. This result should greatly expand the practical potential of charged polaritons and may also lead to increased Coulombic polariton-polariton interactions in organic semiconductors that reduce the threshold for nonlinear phenomena such as parametric amplification, Bose-Einstein condensation, and polariton lasing.

The present invention provides an organic semiconductor microcavity at room temperature. The organic semiconductor cavity may be a heavily doped organic semiconductor sandwiched or embedded in a microcavity. The microcavity is an optical cavity capable of generating an optical resonance. A microcavity is on the scale of the order of wavelength of light. The microcavity may be a pair of mirrors such as dielectric mirrors, a Fabry-Perot cavity or a cylindrical cavity. The microcavity may be semi-transparent to allow the light through. The heavily doped organic semiconductor is able to generate an intense and narrow optical polaron transition, which can be coupled with the optical resonance of the microcavity, thereby forming polaron-polaritons. The polaron-polaritons are charge-carrying inherited from the charge-carrying polarons.

The organic semiconductor microcavity can be said to have a polaron-polariton mode. When a light beam is directed into the organic semiconductor microcavity at an incidence angle and reflected by the microcavity, the optical polaron transition of the heavily doped organic semiconductor will couple with the reflected light and form the polaron-polaritons when the frequency of the reflected light matches with the frequency of the optical polaron transition. Wavelength of the light must be near-resonant with the cavity mode frequency or polaron transition frequency, meaning the frequencies or the associated energies are substantially equal or the difference is within 20%.

In one embodiment, the organic semiconductor is provided with its cation or anions for generating charge-carrying polarons optical transitions. In another embodiment, the organic semiconductor is doped to generate charge-carrying polaron optical transitions. Light is reflected in the microcavity and the reflected light is coupled with the charge-carrying polaron optical transitions in the microcavity, thereby yielding polaron-polariton states with a vacuum Rabi splitting, i.e., upper and lower polaron polariton branches. The polaron-polaritons are charge-carrying inherited from the charge-carrying polarons. Strong coupling between light and free charge carriers is uniquely facilitated in organic semiconductors by intense, narrow linewidth cationic and anionic optical transitions inherited from their constituent molecules. The linewidths of the polaron transitions generally need to be narrower than twice the vacuum Rabi splitting to resolve the upper and lower polariton branches. In general, materials with polaron absorption coefficients exceeding $10^2$ cm$^{-1}$ are required to form polaron polaritons. Examples of the organic semiconductor in accordance with the teaching of the present invention include the hole transport material 4,4'-cyclohexylidenebis[N,N-bis(4-methylphenyl)benzenamine](TAPC), small molecule organic semiconductors such as the linear polyacenes, rubrene, perylene, N,N'-Bis(3-methylphenyl)-N,N'-diphenylbenzidine (TPD), and many others. Additionally, conjugated polymer organic semiconductors such as poly(p-phenylene vinylene), polyfluorene, and many others could also be used.

The organic semiconductor can be provided in a solution or in a solid state. Taking the TAPC as an example, the cation TAPC$^+$ can be created by electrochemically oxiding TAPC with respect to a reference electrode. Alternatively, the TAPC can be p-doped by co-evaporating it with varying concentrations of dopants. The dopants may be metals such as Li, metal oxides such as $MoO_3$ and $WO_3$, or molecular dopants such as F4-TCNQ (2,3,5,6-Tetrafluoro-7,7,8,8-tetracyanoquinodimethane) and $Rb_2CO_3$.

DETAILED DESCRIPTION OF THE DRAWINGS

Figure 1B:
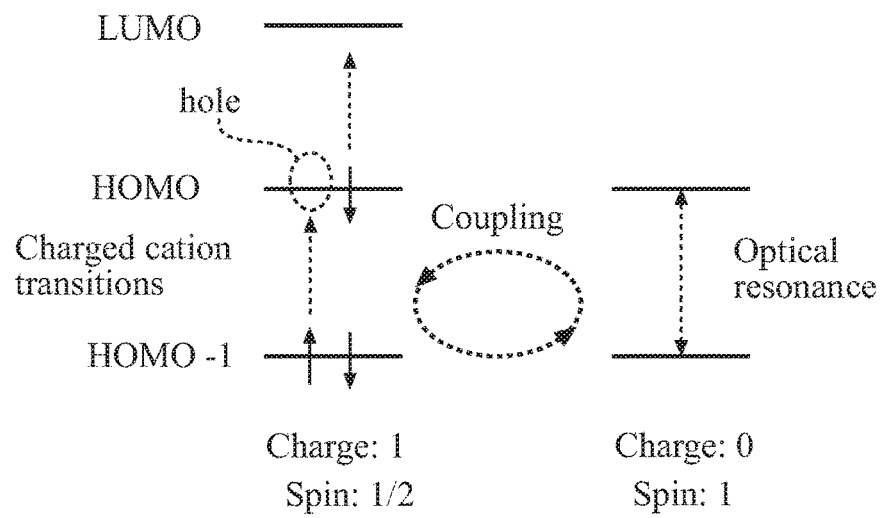
FIG. 1B is a schematic showing a traditional organic semiconductor polaron polariton.

FIGS. 1A and 1B illustrate one embodiment of the notion of an organic polaron polariton and how it differs from a traditional exciton polariton. A traditional organic semiconductor exciton polariton, as shown in FIG. 1A, involves a Frenkel exciton transition between the highest occupied and lowest unoccupied molecular orbitals (HOMO and LUMO, respectively). In the case shown in FIG. 1B, when an electron is removed from a molecule to form the radical cation, a radical cation transition between the HOMO and a lower-lying HOMO is involved. The neutral excitonic transition shown in FIG. 1a is typically replaced by two new polaronic transitions shown in FIG. 1B. In another embodiment, a radical anion, rather than a radical cation, may be involved. In the solid state, the excitation of an electron from a lower-lying molecular orbital into the partially vacant highest occupied molecular orbital (HOMO) can equivalently be viewed as the excitation of a hole.

Figure 2A:
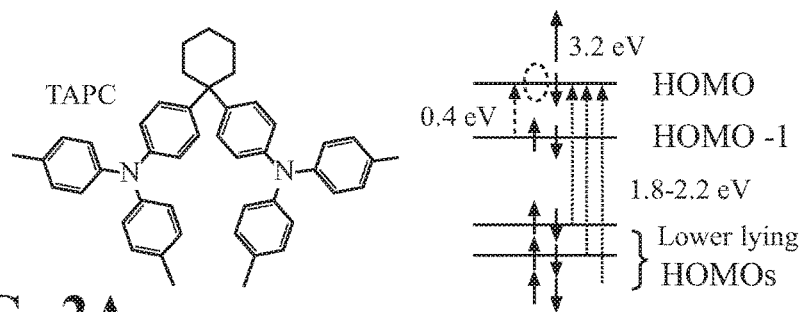
FIG. 2A is a schematic showing a molecular structure of TAPC together with the optical transitions calculated for its cation using the B3LYP functional.
Figure 2B:
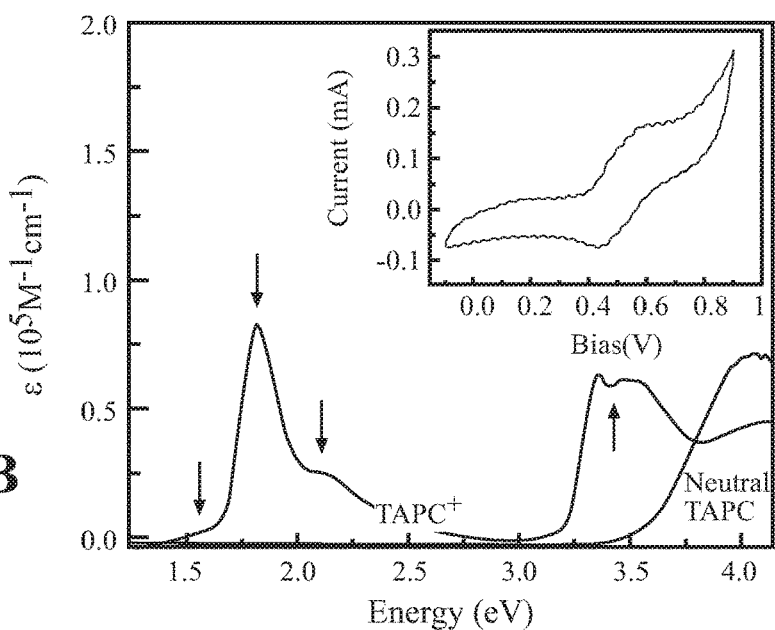
FIG. 2B is a plot showing molar absorption coefficient of neutral TAPC and its cation ($TAPC^+$)

FIG. 2A shows the molecular structure of TAPC alongside the optical transitions calculated for its cation via density functional theory (B3LYP/6-31g**) using a background dielectric constant of 2.5. The lowest energy transitions are all hole excitations, with one deep in the infrared (0.4 eV) originating from the HOMO-1 and several closely spaced in the visible (between 1.8 and 2.2 eV) associated with lower-lying molecular orbitals. FIG. 2B shows that these transitions (indicated by downward arrows) are clearly observed in solution upon electrochemically oxidizing TAPC at its first oxidation potential shown in the inset. Based on these measurements, we estimate a peak molar extinction coefficient of $\varepsilon=8.2\times10^4$ M$^{-1}$ cm$^{-1}$ for the TAPC cation at 1.82 eV.

Figure 2C:
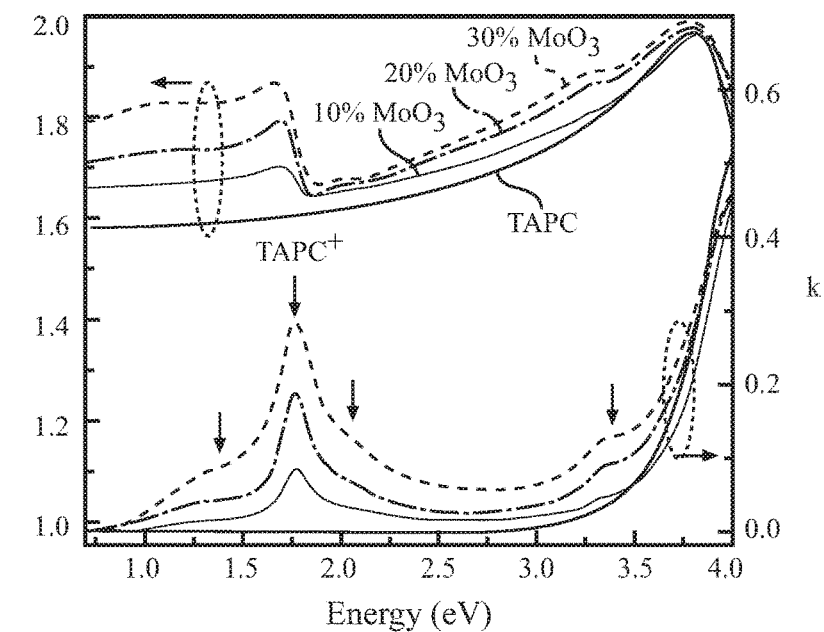
FIG. 2C is a plot showing complex refractive index optical constants, $ñ=n+ik$, determined via variable angle spectroscopic ellipsometry for 40 nm thick films of TAPC co-evaporated with increasing concentrations of $MoO_3$ on a glass substrate.

FIG. 2B shows molar absorption coefficient of neutral TAPC and its cation (TAPC$^+$). The solution consists of 50 μM TAPC dissolved in dichloromethane with a 0.5 M tetrabutylammonium tetrafluoroborate (TBABF4) electrolyte. The cation may be created by electrochemically oxidizing TAPC for 40 minutes at 0.7 V with respect to a Ag/Ag$^+$ reference electrode in acetonitrile containing 0.01 M AgNO$_3$ and 0.1 M TBABF$_4$; the inset shows the associated cyclic voltammetry scan. FIG. 2c shows complex refractive index optical constants, $ñ=n+ik$, determined via variable angle spectroscopic ellipsometry for 40 nm thick films of TAPC co-evaporated with increasing concentrations of MoO$_3$ on a glass substrate. In FIG. 2B and FIG. 2C, the TAPC$^+$ transitions in the 1.5-2.2 eV spectral range are associated with excitation from low-lying states into the partially-occupied HOMO whereas that at approximately 3.4 eV involves excitation from the HOMO into the LUMO as illustrated by the corresponding arrows in FIG. 2A.

The same transitions may also be observed in the solid state when TAPC is p-doped by co-evaporating it with varying concentrations of MoO$_3$, as shown by the optical constant dispersions in FIG. 2C. In this case, the large electron affinity of MoO$_3$ induces electron transfer from the TAPC HOMO, leaving behind a hole. The polaron absorption band peaking at 1.77 eV is consistent with the cation absorption in solution, as shown in FIG. 2B, and is associated with hole excitations to states lying below the HOMO according to the computational model in FIG. 2A. The slight red shift relative to the solution spectrum likely results from the solid-state solvation effect associated with the higher film refractive index, i.e. optical frequency dielectric constant.

The polaron extinction coefficient scales with $MoO_3$ concentration up to approximately 30 wt %, where it peaks at k=0.28 (corresponding to an absorption coefficient $\alpha=4\pi k/\lambda=5\times10^4$ cm$^{-1}$) before declining at higher concentrations. This trend is similar to that of the conductivity in other $MoO_3$-doped hole transport materials and is thought to result from Fermi level pinning within the disorder-induced HOMO density of states. Based on an absorption cross-section, $\sigma=2.5\times10^{-16}$ cm$^2$ derived from the solution-phase molar absorption coefficient above, the TAPC$^+$ polaron density in the 30 wt % doped film is of order $10^{20}$ cm$^{-3}$.

Photoluminescence (PL) from the upper and lower polariton branches of a p-doped 4,4'-cyclohexylidenebis[N,N-bis(4-methylphenyl)benzenamine](TAPC) planar microcavity under non-resonant excitation has also been observed. It is demonstrated both upper and lower branch polariton luminescence from this species in the strong coupling regime. The quantum yield of polaron luminescence is low (~10$^{-4}$) owing to fast internal conversion, yet the predominant mode of polariton population still appears to be radiative via fluorescence from the polaron excited state reservoir. These results clarify the manner in which charged polariton states are populated under non-resonant excitation and are an important prerequisite for exploring possible lasing or condensation phenomena with this species in the future.

Figure 3A:
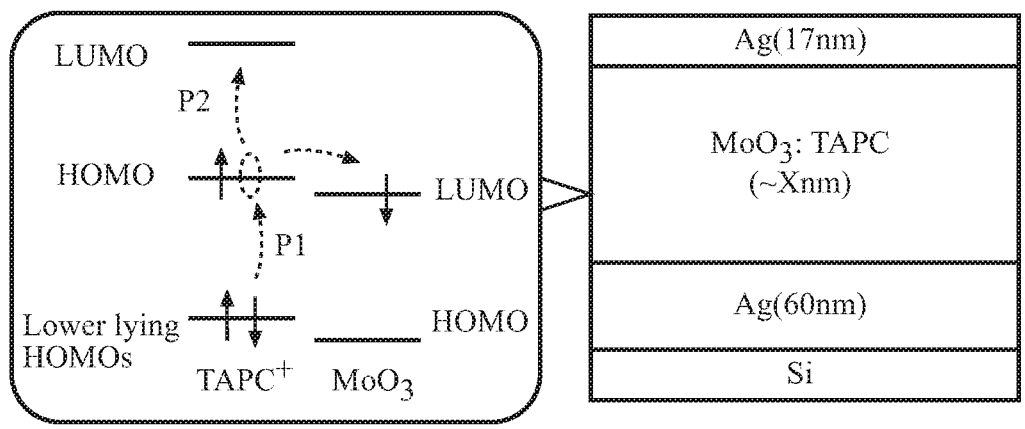
FIG. 3A is schematic showing the microcavity structure and polaron optical transitions that arise upon p-doping TAPC with $MoO_3$.

FIG. 3A shows a schematic of the microcavity structure together with an energy level diagram illustrating the manner in which TAPC is p-doped by $MoO_3$ through ground-state electron transfer from the highest occupied molecular orbital (HOMO). This results in two new optical transitions, $P_1$ and $P_2$, that respectively correspond to excitation of an electron into, and out of, the now partially-occupied HOMO. Though the cartoon in FIG. 3A is drawn for an isolated molecular cation, these optical transitions remain largely unchanged in the solid state due weak intermolecular electronic coupling, where $P_1$ is now equivalently viewed as the excitation of a hole polaron. The thickness of the $MoO_3$:TAPC layer in the cavity ranges from 175 nm to 145 nm depending on its detuning.

Figure 3B:
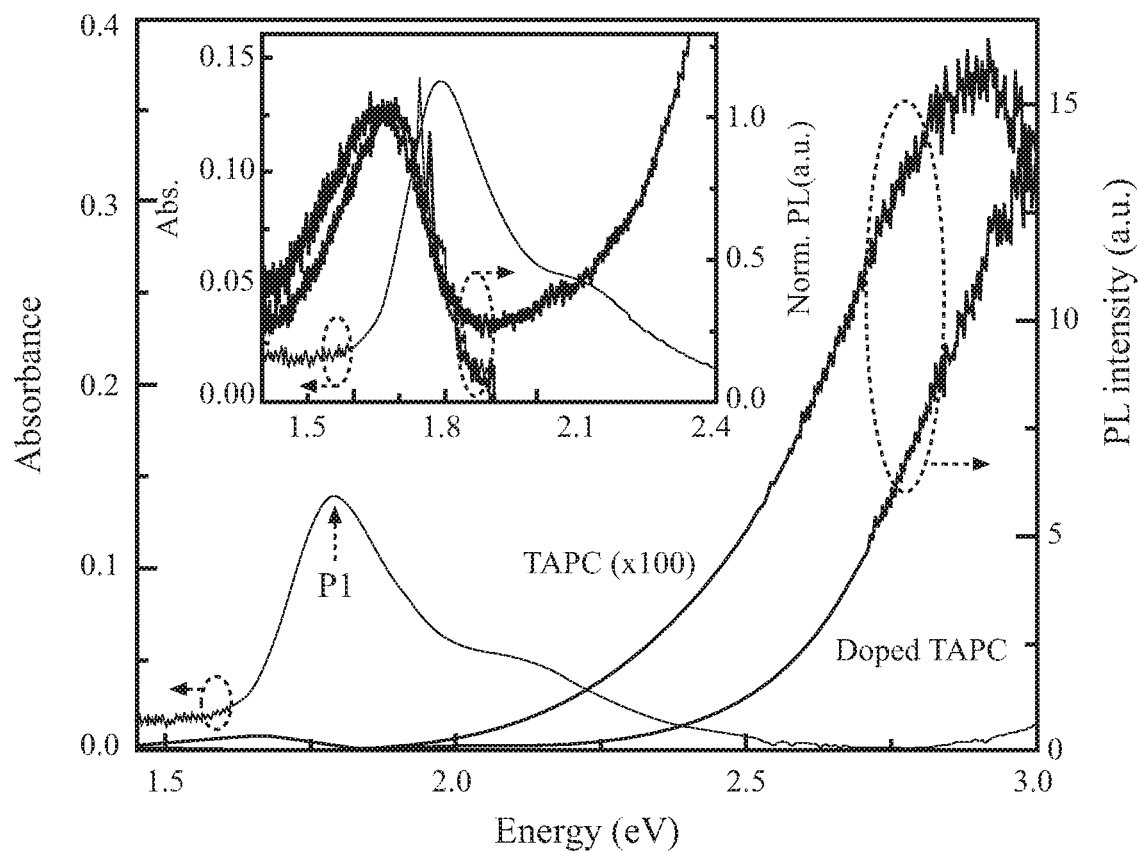
FIG. 3B is a plot showing absorption (left-hand axis) and emission (right-hand axis) spectra collected from 50 nm-thick film of neat TAPC and a 165 nm-thick film of 10 wt % $MoO_3$:TAPC under $\lambda=375$ nm excitation; the inset shows a magnified view of these spectra in the vicinity of the $P_1$ polaron transition.

FIG. 3B shows the absorption coefficient measured for a 10 wt % $MoO_3$:TAPC film. There, the $P_1$ hole transition peaks at $E_P$=1.77 eV, with the shoulder at ~2.2 eV also originating from a hole transition to another, slightly deeper molecular orbital; the $P_2$ and neutral molecule transitions both take place at higher energy (~3.3 eV and ~4 eV, respectively) and are not captured on this axis. FIG. 3B also shows the photoluminescence (PL) spectrum of this film, acquired alongside that of an undoped reference TAPC film under $\lambda$=375 nm excitation using a $\lambda$=410 nm long-pass filter. Relative to the reference PL, neutral TAPC fluorescence in the doped film is blue-shifted and strongly quenched. Quenching presumably reflects energy transfer to the lower energy polaron transitions whereas the blue-shift is a consequence of the broad density of states (DOS) in the film, since molecules in the upper portion of the DOS (i.e. those with the highest HOMOs and thus more likely to possess a lower HOMO-LUMO gap) are the most likely to be ionized by $MoO_3$ (and occupied by extrinsic holes), effectively eliminating them from the neutral molecule fluorescence ensemble.

The most striking feature of the doped film PL spectrum, however, is the weak emission band located at 1.66 eV (see inset of FIG. 3B), which we assign to the $P_1$ polaron transition. Emission from charged molecules is rare in the literature due to fast internal conversion and all the more remarkable in this case because it is observed in the solid state at room temperature. It is observed here under non-resonant ($\lambda$=375 nm; green line) and near-resonant ($\lambda$=633 nm, orange line) excitation, though in the latter case, a sharp additional line at ~1.77 eV is superimposed. This is a Raman line of the TAPC cation, an assignment supported by the fact that it shifts appropriately upon exciting at $\lambda$=640 nm (red line) while the polaron emission remains unchanged. High resolution Raman spectroscopy shows that this peak is actually a doublet, with Raman shifts of 1580 cm$^{-1}$ and 1601 cm$^{-1}$ that originate from neutral TAPC but gain strongly in intensity for TAPC$^+$.

Figure 3C:
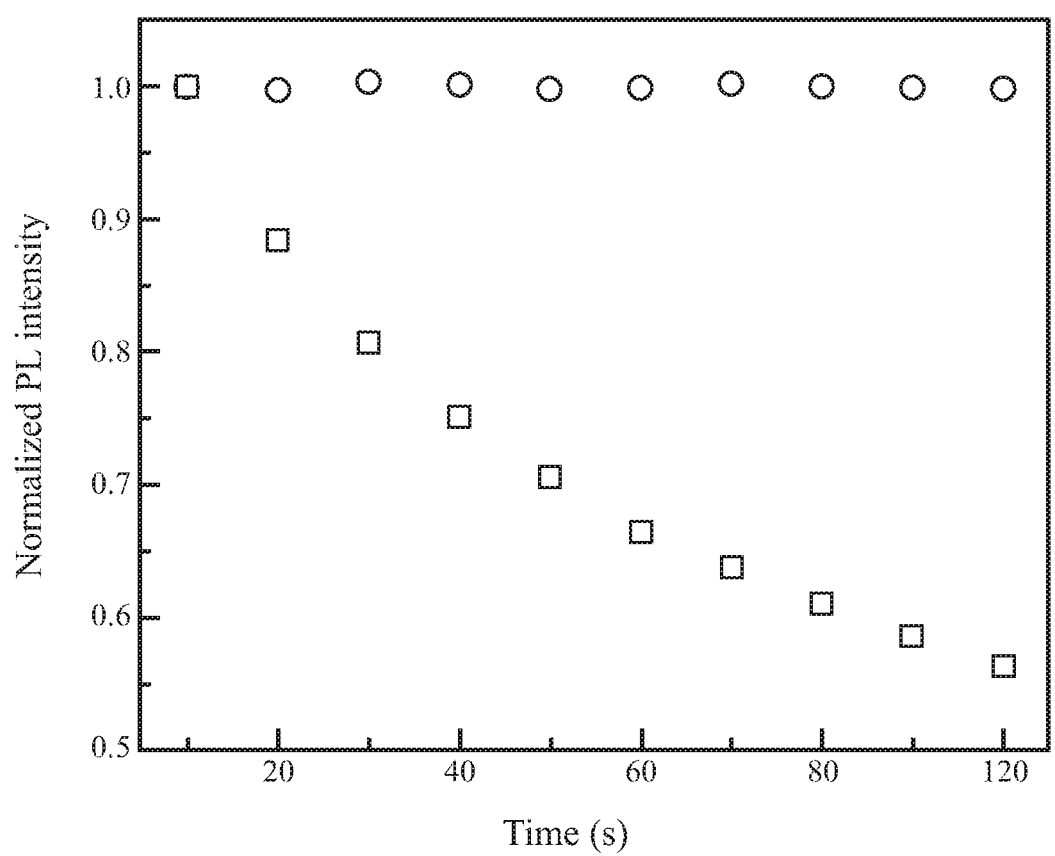
FIG. 3C is a plot showing that the polaron emission is photostable under $\lambda=640$ nm (circles) excitation but degrades rapidly and irreversibly when excited by $\lambda=375$ nm (squares) light with the same intensity.

FIG. 3C shows that the polaron PL is photostable when excited at $\lambda$=640 nm but degrades rapidly when excited at $\lambda$=375 nm. The PL degradation in the latter case is irreversible, is largely the same regardless of whether the measurement is carried out in ambient air or vacuum, and is mirrored by a reduction in the polaron absorbance. These observations suggest that TAPC molecular cations may undergo chemical degradation in the presence of neutral TAPC excitons, possibly via the same exciton-polaron annihilation mechanism that causes molecular fragmentation in organic light emitting diodes. Alternatively, it may be that directly exciting the P2 transition of TAPC$^+$ (which also absorbs at $\lambda$=375 nm) leads to molecular instability.

The comparable intensities of the Raman and polaron PL spectra in FIG. 3B attest to the very low PL quantum yield of the latter, which we estimate to be $\phi_0$~10$^{-4}$ using a film of tris-(8-hydroxyquinoline)aluminum (Alq$_3$) as a reference standard[15]. This is consistent with the rapid, $\tau_0$~1 ps decay of the polaron excited state measured via ultrafast transient absorption[6] and implies radiative and non-radiative polaron decay rates of $k_r$=$\phi_0/\tau_0$~10$^8$ s$^{-1}$ and $k_{nr}$≈1/$\tau_0$~10$^{12}$ s$^{-1}$, respectively. The radiative rate is in good agreement with that predicted by the Strickler-Berg relation on the basis of the polaron molar absorption coefficient.

Figure 4A:
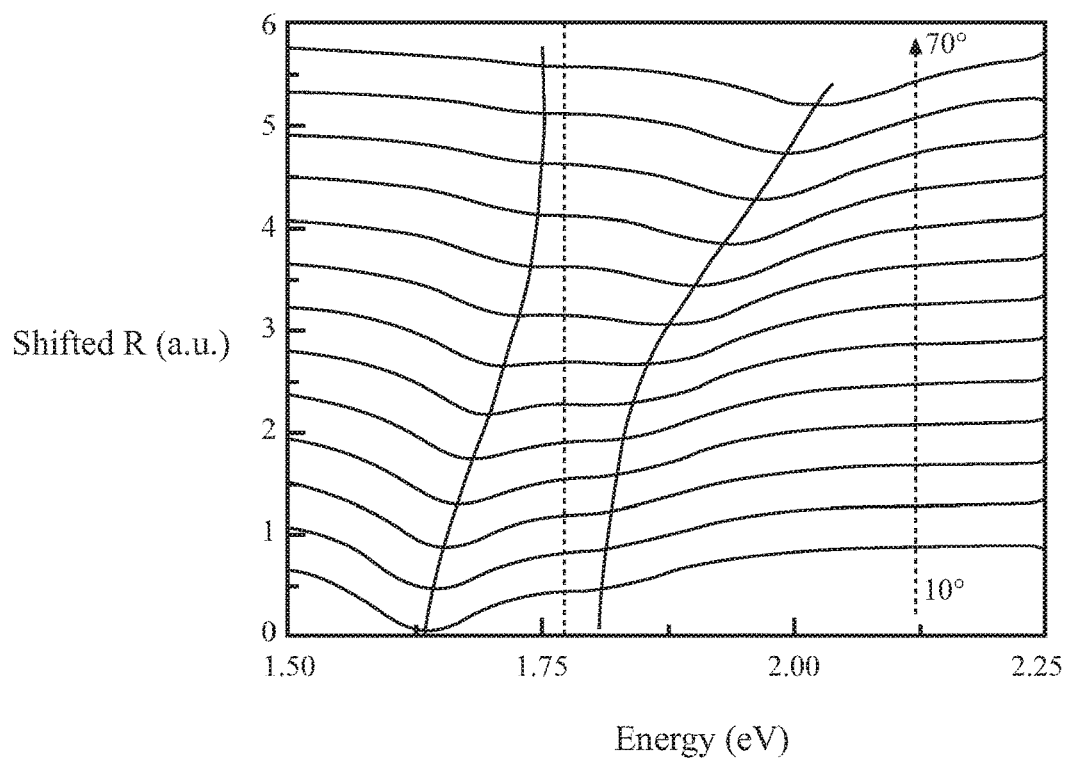
FIG. 4A is a plot showing a s-polarized reflectivity spectra collected from a 165 nm-thick 10 wt % $MoO_3$:TAPC microcavity ($\Delta=-0.11$ eV) at incidence angles ranging from 10° to 70° in 5° increments.
Figure 4B:
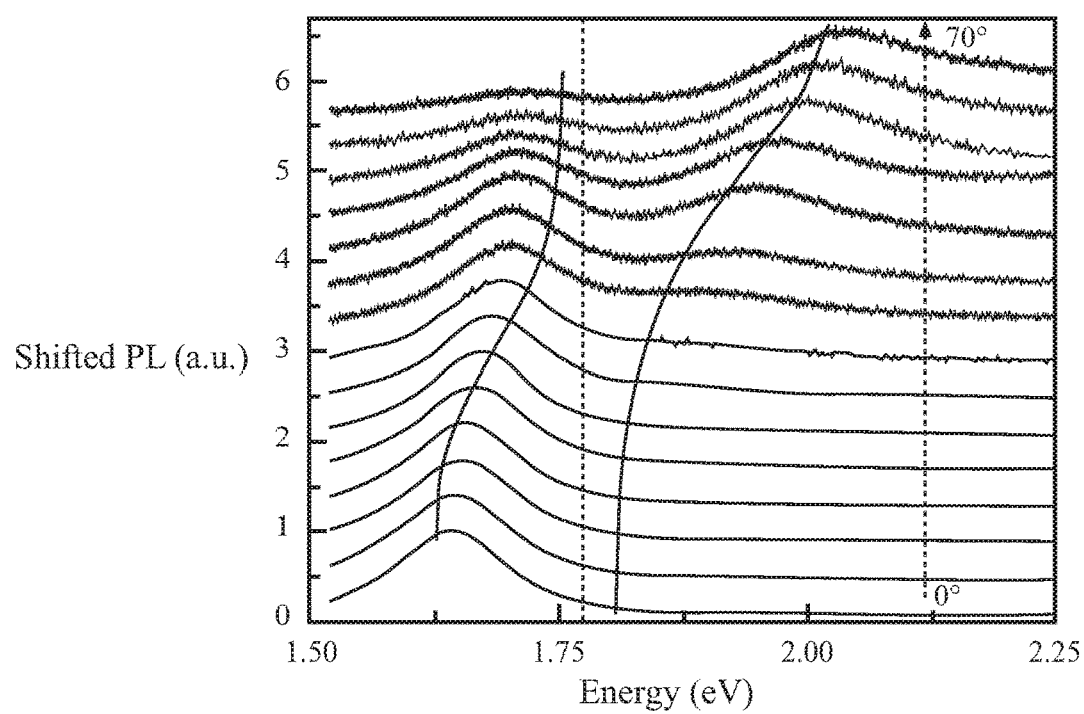
FIG. 4B is a plot showing normalized photoluminescence spectra collected from the same sample as in FIG. 4A, exciting non-resonantly at $\lambda=375$ nm and detecting through an s-oriented polarizer at angles ranging from 0° to 70°.
Figure 4C:
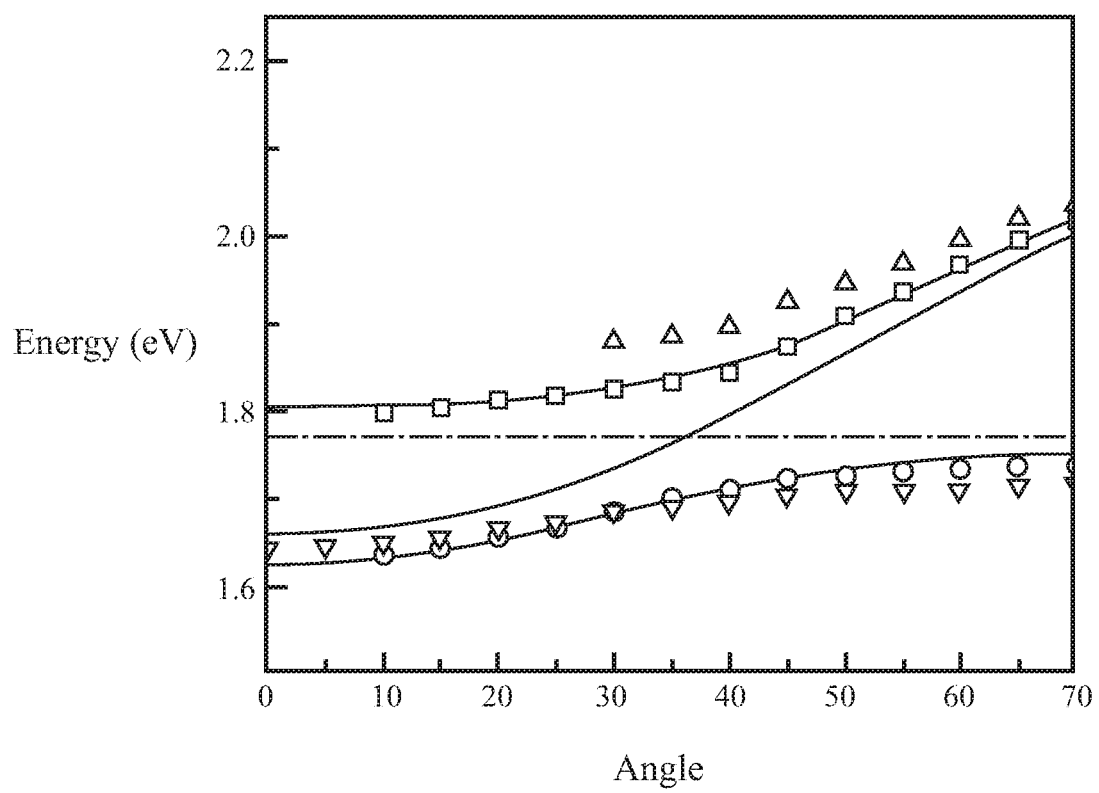
FIG. 4C is a plot showing polariton dispersion extracted via Gaussian peak fitting of the reflectivity (square) and emission (triangles) spectra in FIGS. 4A and 4B.

FIG. 4A shows the angle-dependent reflectivity spectra collected for the cavity architecture illustrated in FIG. 3A, where the thickness of the 10 wt % $MoO_3$:TAPC active layer is chosen to negatively detune the cavity mode (energy $E_C$ at zero in-plane wavevector) relative to the polaron transition by $\Delta=E_C-E_P$=−0.11 eV. Consistent with previous work, we observe a clear anti-crossing in the reflectivity dips about the bare polaron transition energy (denoted by the green dashed line) that signifies the existence of upper and lower polariton (UP and LP, respectively) branches in the strong coupling regime. A similar evolution is observed in angle-dependent PL spectra collected from the cavity under non-resonant ($\lambda$=375 nm, with periodic translations to avoid photodegradation) excitation in FIG. 4B. There, emission from the LP branch dominates the spectrum at low angle whereas emission from the UP branch dominates at high angle. FIG. 4C plots the polariton mode dispersions determined from Gaussian multi-peak fitting of the reflectivity and PL data, demonstrating good overall agreement between the two. The data are well-described using a simple coupled oscillator model shown by the solid lines fitted to the data points, which yields a vacuum Rabi splitting of $\hbar\Omega$=0.11±0.03 eV based on a cavity mode linewidth, $\delta_\gamma$~0.08 eV, and negligible homogeneous broadening of the polaron transition. The solid fitted lines result from fitting the reflectivity data with a coupled oscillator model based on the bare cavity mode dispersion and polaron transition energy shown by the dashed upward and dashed horizontal lines, respectively.

FIG. 5A displays a map of the PL intensity for this cavity (not normalized at each individual angle as in FIG. 4B), which demonstrates that the emission peaks in the LP branch at zero in-plane wavevector ($k_\parallel=0$), similar to neutral organic polariton systems. By contrast, decreasing the $MoO_3$:TAPC layer thickness to positively detune the cavity ($\Delta=+0.11$ eV) leads to a relative increase in UP emission intensity as shown in FIG. 5B. This may simply reflect an increasing contribution of background fluorescence into the UP mode that originates from the neutral TAPC emission tail (see FIG. 3B). Subsequent relaxation from the upper to lower branch is inefficient in this case because the predominantly photonic character of the UP branch suppresses the interbranch relaxation rate, which is proportional to the product of UP and LP polaronic Hopfield coefficients. Combined with the faster radiative decay of the more photon-like UP (roughly equal to the cavity photon lifetime, $\tau_C\sim 8$ fs), which affords less time to relax in the first place, the increase in UP emission observed for the positively detuned cavity is not unexpected. Solid black circles denote the dispersion observed in reflectivity and upward and horizontal dashed lines indicate the uncoupled cavity mode dispersion and polaron transition energy, respectively.

FIGS. 5C and 5D show that transfer matrix dipole emission modeling qualitatively reproduces the photoluminescence of each cavity, suggesting that the PL in both cases can be understood on the basis of reservoir excited state fluorescence into the polariton modes. This radiative mode of polariton population is associated with emission from uncoupled polaron (and neutral TAPC tail) excited states into the wedge of optical étendue that makes up the photonic component of a polariton mode. The agreement between data and simulation in FIGS. 5A-5D not only argues for a predominantly radiative mode of polariton population (as opposed to phonon scattering from the polaron excited state reservoir), it also implies that inter- and intra-branch polariton relaxation are negligible since they are not accounted for in the model.

Figure 6A:
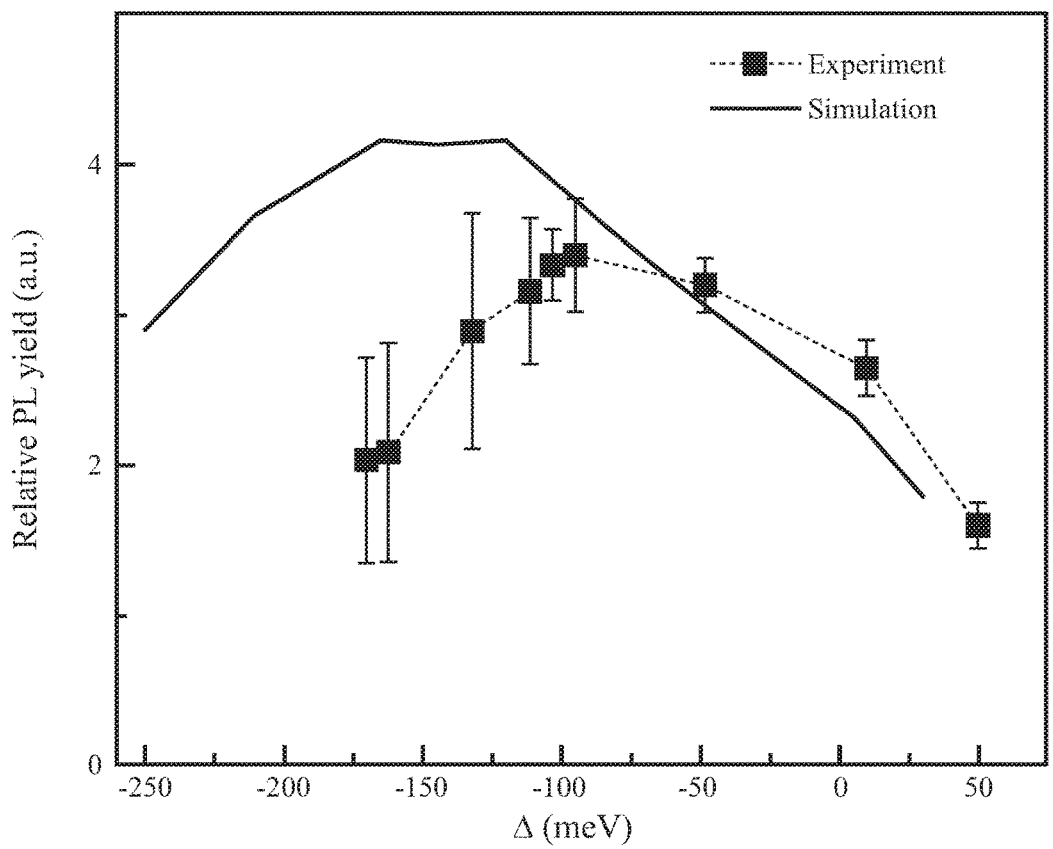
FIG. 6A is a plot showing the relative intensity of LP emission collected at normal incidence for a series of samples with different cavity detuning.
Figure 6B:
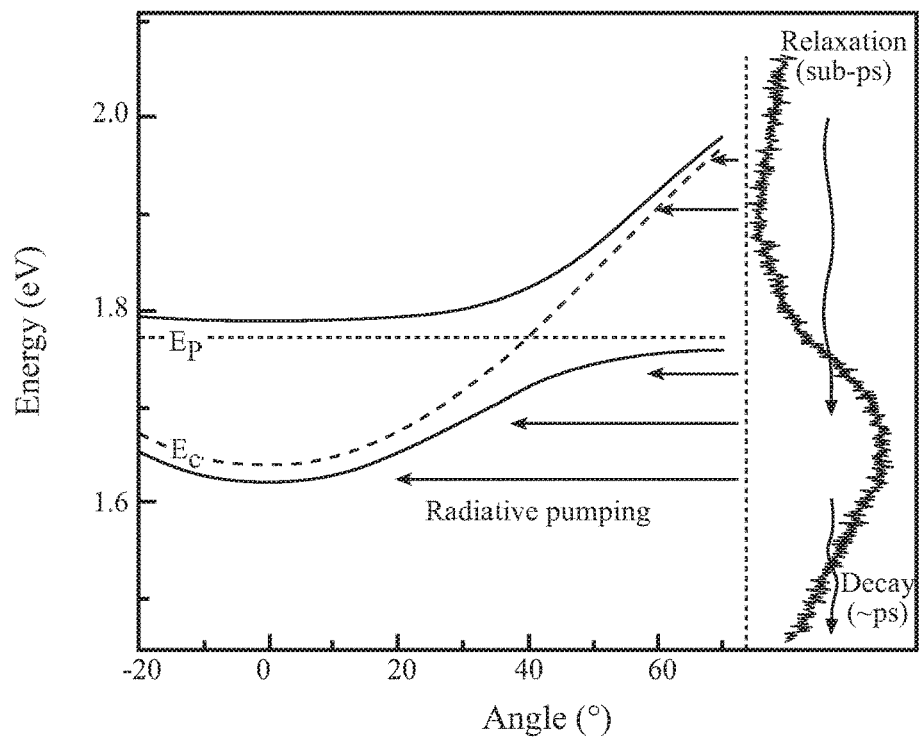
FIG. 6B is a schematic showing the dominant polariton population and relaxation pathways in the system in accordance with an embodiment of the present invention.

FIG. 6A examines the integrated LP emission intensity collected at normal incidence as a function of the cavity detuning. The data are corrected for changes in the absorbed fraction of the $\lambda=375$ nm pump laser and are normalized to the emission from a bare 10% $MoO_3$:TAPC film on Si measured under identical conditions. This plot shows that the relative LP emission yield peaks when the detuning equals the Stokes shift of the uncoupled PL (roughly 0.11 eV), in reasonable quantitative agreement with the transfer matrix model (solid line) except at large negative detuning, where the uncertainty in the experimental data increases due to a higher order cavity mode that strongly increases the pump absorption. These observations lend further support to the notion that LP states are populated radiatively in proportion to their overlap with the bare polaron fluorescence spectrum (i.e. the polaron excited state reservoir) as illustrated in FIG. 6B. The apparent lack of competitive phonon scattering into the LP branch in this case may be related to the high energy of the dominant polaron Raman modes (~0.2 eV; see FIG. 3B) which, combined with the large Stokes shift, would require a cavity detuning of almost $\Delta=-0.35$ eV (and thus a very photon-like LP branch) to satisfy energy conservation in a transition to $k_\parallel=0$.

Fast vibronic relaxation following non-resonant excitation (the longer downward arrow) leads to a reservoir of polaron excited states with a distribution approximated by the bare polaron photoluminescence spectrum shown in gray (note that the high energy component above ~1.9 eV is the neutral TAPC emission tail). These reservoir states decay on a ~ps timescale (the shorter downward arrow) and populate the lower polariton branch mainly via radiative pumping. Dashed green, dashed purple, and solid red lines correspond to the bare polaron transition energy, cavity mode dispersion, and polariton dispersion of the $\Delta=-0.13$ eV sample in FIG. 6A;

Taken together, these data demonstrate that polaron polaritons are readily achievable at room temperature using organic semiconductors. This species is distinct from trion polaritons[8,9] as well as alternative multi-particle notions of a polaron polariton[10] and it carries a number of implications that are interesting to consider. First, the dependence of the Rabi splitting on polaron density established in FIG. 4b should make it possible to electrically gate the strong coupling regime in much the same manner as intersubband systems, which are probably the closest inorganic semiconductor analog. Polaron densities exceeding $10^{18}$ cm$^{-3}$ (i.e. comparable to that used here) are readily achievable in organic thin film transistors, though the nanometer thickness of typical accumulation layers will require the photon mode to be tightly confined near the organic semiconductor/gate dielectric interface. Beyond electrostatic control over their energy, charged polaritons have been predicted to accelerate in an applied electric field[9] and they may offer interesting magnetic field effects owing to the unpaired half-integer spin of the underlying radical cations/anions.

It is also possible that polaron polaritons will interact with one another more strongly than exciton polaritons, which is significant because it would lower the threshold for nonlinear polariton phenomena such as parametric amplification, Bose-Einstein condensation, and lasing. While no direct Coulomb interaction is expected between them (i.e. only the excitation of polarons propagates, so the position of polarons relative to one another, and thus their Coulomb repulsion, does not change as two polaritons approach one another), there may be secondary effects that are nonetheless significant. For example, the electronic polarization of the surrounding molecules may change in the transition between polaron ground and excited states since the wavefunction of the latter is typically more extended. Owing to the low dielectric constant of organic materials, this would provide the basis for a long range Coulombic polariton-polariton interaction, which is normally negligible for organic semiconductor exciton polaritons.

Further, it is interesting to consider the extent to which strong polaron-photon coupling might alter organic semiconductor electrical properties, as reported previously for neutral exciton polariton systems. Polaron polaritons, by comparison, may offer a more direct link to electrical properties since the excitation of free charge carriers themselves is shared via the cavity mode. This may give rise to, for example, enhanced photoconductivity in a polaron polariton system that is analogous to enhanced exciton conductance that has been predicted for exciton polariton systems.

Figure 7:
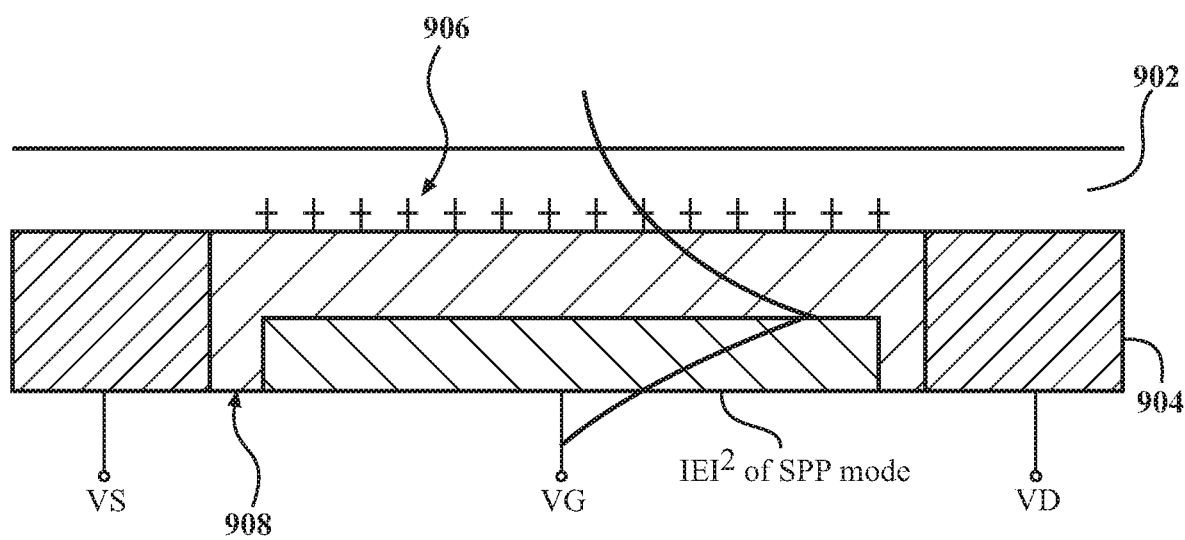
FIG. 7 is a schematic showing another embodiment of a device for creating polaron polaritons electrostatically.

So far, discussion involves creating polaron polaritons chemically. In an alternative embodiment, polaron polaritons may be created electrostatically. FIG. 7 shows an embodiment of a device for creating polaron polaritons electrostatically. FIG. 7 provides an organic thin film transistor architecture 902, but with a metal gate 904 that supports a surface plasmon mode or other tightly confined optical modes. $V_S$, $V_G$, $V_D$ and 908 represent for metal source, metal gate, metal drain and insulating gate dielectric respectively. In one example, the organic semiconductor is a film of TAPC about 100 nm thick. The insulating gate dielectric is a film of MO about ~50 nm. Applying negative gate voltage will accumulate a large hole density 906 (TAPC+ molecules) in the channel of the device at the gate dielectric interface. Similarly, applying positive gate voltage will accumulate a large electron density in the channel of the device. The resulting density of positively charged TAPC$^+$ molecules may have an interaction with the surface plasmon mode (SPP) supported by the gate electrode substantial enough to create hybrid charged polariton modes. In one embodiment, the organic material may be TAPC. Other small molecule organic semiconductor may be used.

Applications and Devices

The light-matter hybrid species, i.e., polaron polaritons, created with the method of the present invention, may be useful in a variety of applications, such as lower threshold lasing and coherent light emission, nonlinear frequency conversion, and parametric amplification. In addition, polaron polaritons may be useful in polariton-based information processing and logic operations because polaron polaritons can be manipulated directly with applied electric fields. The strong polaron photon coupling regime may also be useful to modify the electrical properties of organic semiconductors simply by controlling their optical environment.

Example 1

Figure 8A:
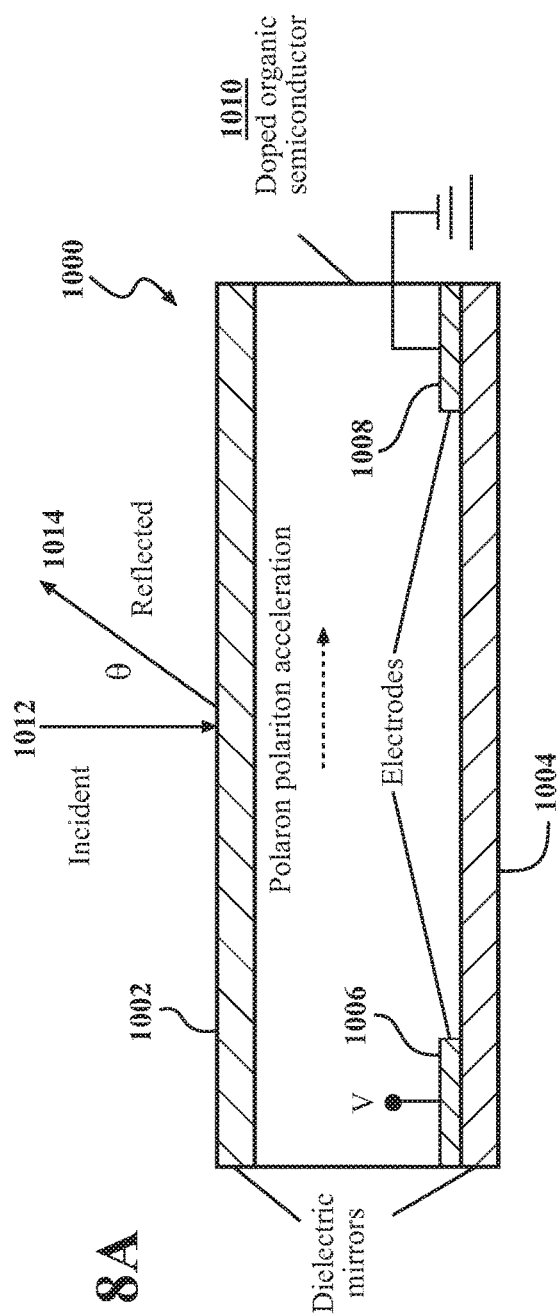
FIG. 8A is a schematic showing electrical acceleration of polaron polaritons to module the direction and frequency of light.

Polaron polaritons can be used to enable electrical control over light and vice versa. It is in principal possible to accelerate polaron polaritons by applying an electric field in order to realize an electrooptic modulator that could control the direction of a light beam electrically. An embodiment of this device 1000 could be a Fabry-Perot cavity with dielectric mirrors 1002, 1004 sandwiching the doped organic semiconductor active layer 1010 with two coplanar contacts 1006, 1008 included in the cavity, as shown in FIG. 8A. Applying an electric field between the two contacts would generate an electric current flowing between the contacts and, light 1012 incident resonantly into the polaron polariton modes would gain an additional in-plane momentum component from the drift of the polarons, resulting in a slight angular deviation $\theta$ of the reflected light beam 1014 that depends on the magnitude and direction of the current.

Figure 8B:
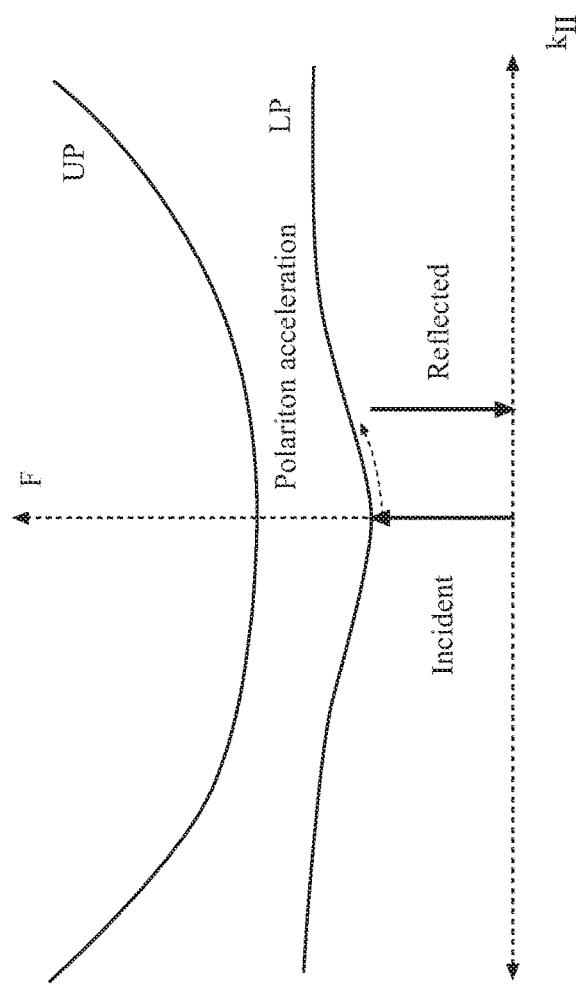
FIG. 8B is a plot showing how the operation of the device in FIG. 10a works in energy-momentum space.

FIG. 8B shows how the operation of the device 1000 in FIG. 10a works in energy-momentum space.

Example 2

Figure 9:
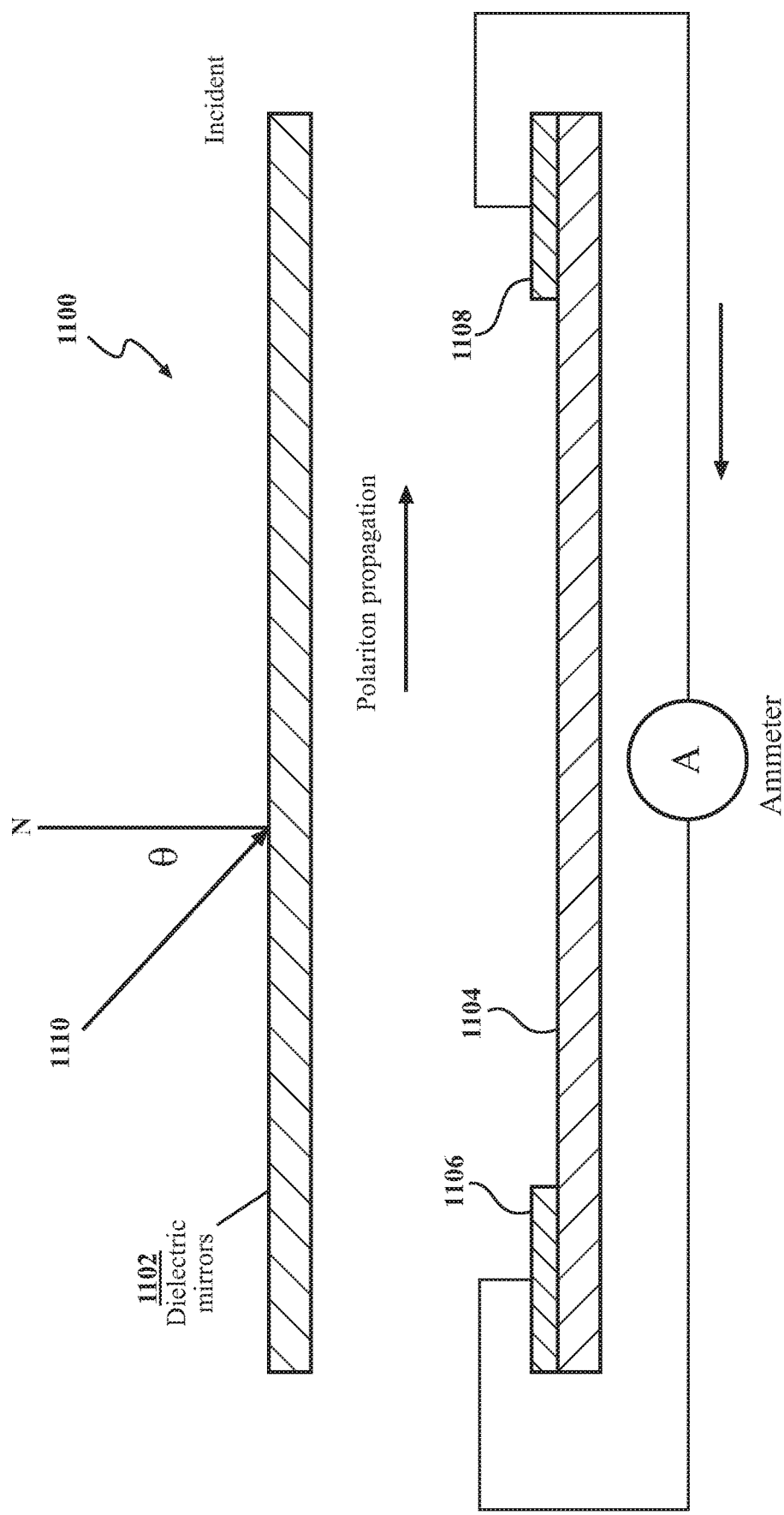
FIG. 9 is a schematic showing a current flow associated with polaron polariton propagation enabling a new type of photodetector.

A device 1100 similar to the above device 1000 could also be operated in reverse, as shown in FIG. 9. An embodiment of this device 1100 could be a Fabry-Perot cavity with dielectric mirrors 1102, 1104 sandwiching a doped organic semiconductor active layer (not shown). Two coplanar contacts 1106, 1108 are included in the cavity for measurement of the electric current. There is no electrical field applied between the contacts 1106, 1108. An incident light beam 1110 at an angle $\theta$ onto the device 1100 generates a small current between the electrodes that depends on the intensity and direction of the incident light beam. This mode of operation is very similar to photon and surface plasmon drag detectors; however, in this case, we would be taking advantage of charged polariton drag, which might lead to a stronger effect.

Example 3

Figure 10:
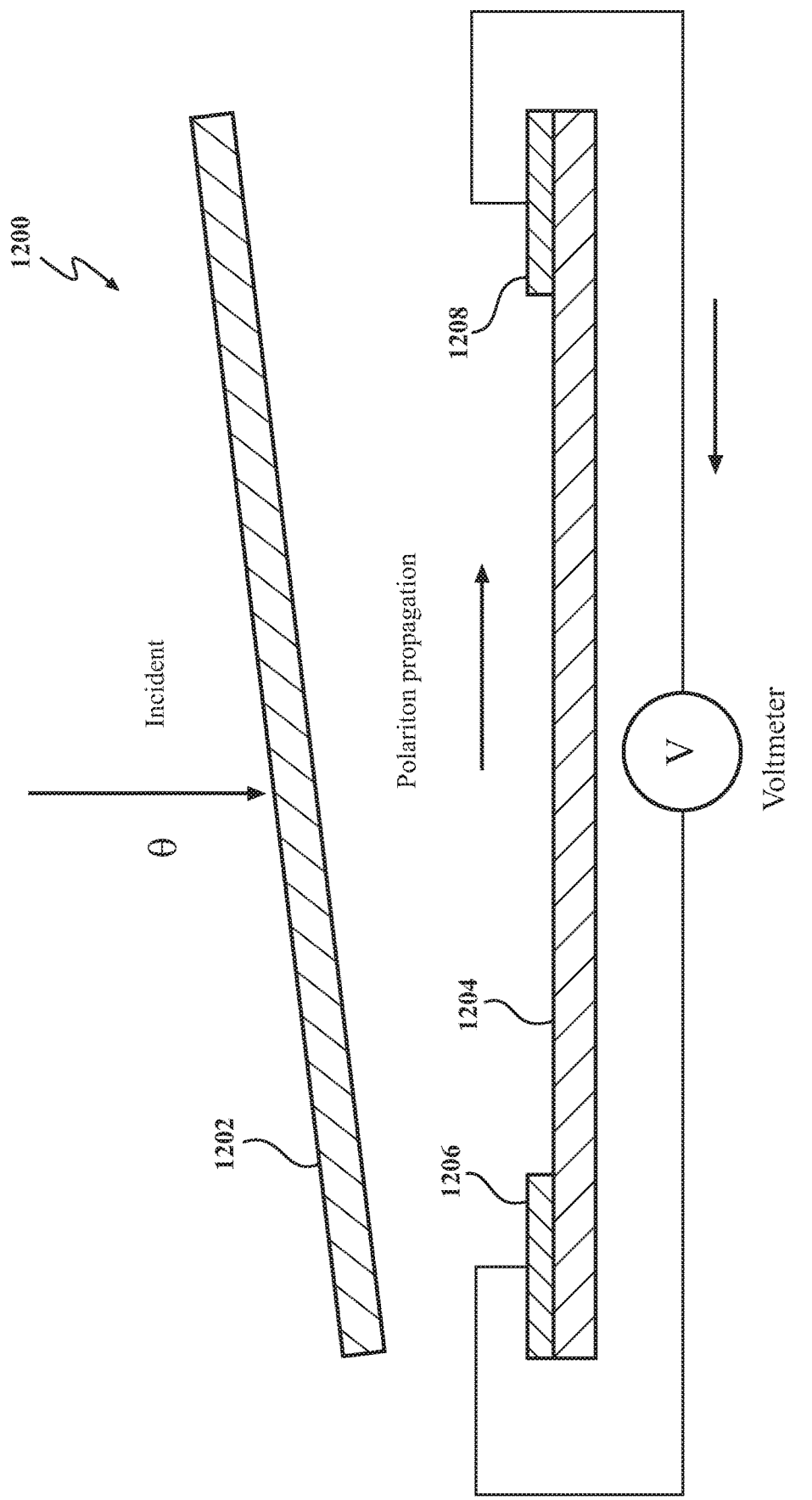
FIG. 10 is a schematic showing that creating a wedged cavity would induce polaron polariton acceleration and lead to a photovoltage (V) detected between the two electrodes.

Another possibility application is the polariton-voltaics. In this case, the Fabry-Perot cavity would be wedged, with the thickness of the organic semiconductor active layer varying from one side to the other. As shown in FIG. 10, this device 1200 could be a wedged Fabry-Perot cavity with dielectric mirrors 1202, 1204 sandwiching a wedged doped organic semiconductor active layer (not shown) with two coplanar contacts 1006, 1208 included in the cavity. An electric field is applied between the two contacts to generate an electric current flowing between the contacts.

This wedge would laterally change the cavity detuning and hence would cause the energy of the polariton modes to also vary laterally. The gradient in polariton potential energy results in a force that pushes polaritons laterally. In the case at hand, the fact that polaron polaritons have a net charge associated with them means that any flow of them imparted by such a cavity wedge should also lead to a separation of charge and thus to the formation of a lateral electric potential. This is a fundamentally new type of photovoltaic effect, which is termed as the polariton-voltaic effect, which may offer new possibilities for light detection and optical signal processing.

As will be clear to those of skill in the art, the embodiments of the present invention illustrated and discussed herein may be altered in various ways without departing from the scope or teaching of the present invention. Also, elements and aspects of one embodiment may be combined with elements and aspects of another embodiment. It is the following claims, including all equivalents, which define the scope of the invention.

REFERENCES

1 Skolnick, M. S., Fisher, T. A. & Whittaker, D. M. Strong coupling phenomena in quantum microcavity structures. *Semicond. Sci. Tech.* 13, 645, (1998).
2 Holmes, R. J. & Forrest, S. R. Strong exciton-photon coupling in organic materials. *Org. Electron.* 8, 77-93, (2007).
3 Gibbs, H. M., Khitrova, G. & Koch, S. W. Exciton-polariton light-semiconductor coupling effects. *Nat. Photon.* 5, 273-273, (2011).
4 Torma, P. & Barnes, W. L. Strong coupling between surface plasmon polaritons and emitters: a review. *Reports on Progress in Physics* 78, 013901, (2015).
5 Christmann, G., Askitopoulos, A., Deligeorgis, G., Hatzopoulos, Z., Tsintzos, S. I., Savvidis, P. G. & Baumberg, J. J. Oriented polaritons in strongly-coupled asymmetric double quantum well microcavities. *Appl. Phys. Lett.* 98, 081111, (2011).
6 Cristofolini, P., Christmann, G., Tsintzos, S. I., Deligeorgis, G., Konstantinidis, G., Hatzopoulos, Z., Savvidis, P. G. & Baumberg, J. J. Coupling quantum tunneling with cavity photons. *Science* 336, 704-707, (2012).
7 Brunhes, T., André, R., Arnoult, A., Cibert, J. & Wasiela, A. Oscillator strength transfer from X to X+ in a CdTe quantum-well microcavity. *Phys. Rev. B* 60, 11568, (1999).
8 Rapaport, R., Harel, R., Cohen, E., Ron, A., Linder, E. & Pfeiffer, L. N. Negatively charged quantum well polaritons in a GaAs/AlAs microcavity: An analog of atoms in a cavity. *Phys. Rev. Lett.* 84, 1607, (2000).
9 Rapaport, R., Cohen, E., Ron, A., Linder, E. & Pfeiffer, L. N. Negatively charged polaritons in a semiconductor microcavity. *Phys. Rev. B* 63, 235310, (2001).

10. Sidler, M., Back, P., Cotlet, O., Srivastava, A., Fink, T., Kroner, M., Demler, E. & Imamoglu, A. Fermi polaron-polaritons in charge-tunable atomically thin semiconductors. *Nat. Phys.* 13, 255-261, (2017).

The invention claimed is:

1. A method of generating a light-matter hybrid species of charged polaritons at room temperature, the method comprising the steps of:
    providing an organic semiconductor microcavity, the organic semiconductor microcavity including a doped organic semiconductor sandwiched in a microcavity capable of generating an optical resonance, the doped organic semiconductor being a hole/electron transport material having a polaron absorption coefficient exceeding $10^2$ cm$^{-1}$ and capable of generating a polaron optical transition with a linewidth smaller than a predetermined threshold, the optical resonance of the microcavity having a resonance frequency matched with the polaron optical transition; and
    coupling light to the polaron optical transition in the organic semiconductor microcavity thereby forming polaron-polaritons, the polaron-polaritons being charge-carrying polaritons.

2. The method according to claim 1, wherein the hole/electron transport material has a binding energy high enough such that the polaron optical transition is observed at room temperature.

3. The method according to claim 1, wherein the organic semiconductor is selected from 4,4'-cyclohexylidenebis[N,N-bis(4-methylphenyl)benzenamine](TAPC), linear polyacenes, rubrene, perylene, and N,N'-Bis(3-methylphenyl)-N,N'-diphenylbenzidine (TPD).

4. The method according to claim 1, wherein the microcavity is a Fabry-Perot cavity.

5. The method according to claim 1, the step of fabricating an organic semiconductor microcavity comprises p-doping the organic semiconductor by co-evaporating the organic semiconductor with a concentration of dopants including metals, metal oxides, or molecular dopants.

6. The method according to claim 5, wherein the dopants includes $MoO_3$, $WO_3$ or F4-TCNQ (2,3,5,6-Tetrafluoro-7,7,8,8-tetracyanoquinodimethane) for introducing positive polarons.

7. The method according to claim 5, wherein the dopants includes alkali metals or $Rb_2CO_3$ molecules introducing negative polarons.

8. The method according to claim 5, the step of fabricating the organic semiconductor microcavity comprises p-doping the TAPC by co-evaporating the TAPC with a concentration of $MoO_3$ forming a $MoO_3$:TAPC film, the $MoO_3$:TAPC film sandwiched between the microcavity according to a structure: glass substrate/Ag (100 nm)/$MoO_3$:TAPC/Ag (17 nm).

9. The method according to claim 1, wherein the polaron-polaritons are positively charged.

10. The method according to claim 1, wherein the polaron-polaritons are negatively charged.

11. The method according to claim 8, wherein the TAPC$^+$ polaron density in 30 wt % $MoO_3$ doped organic semiconductor film is of an order of $10^{20}$ cm$^{-3}$.

12. The method according to claim 8, wherein the thickness of $MoO_3$:TAPC film ranges from 175 nm for 10 wt % $MoO_3$ to 155 nm for 30 wt % $MoO_3$.

13. A method of controlling a direction of light beam, the method comprising steps of:
    providing an organic semiconductor microcavity with a microcavity sandwiching a doped organic semiconductor active layer, the organic semiconductor microcavity having a polaron-polariton mode and two electric contacts;
    applying an electric field between the two electric contacts generating an electric current flowing between the two electric contacts causing a drift of the polarons;
    directing a light beam having a wavelength at an incident angle into the organic semiconductor microcavity, resulting in an optical resonance with the polaron-polariton mode, gaining an additional in-plane momentum component from the drift of the polarons, resulting in an angular deviation of the reflected light beam; and
    controlling the direction of the reflected light by controlling magnitude and direction of the current.

14. A method of generating an electric current using a doped organic semiconductor microcavity, comprising the steps of:
    providing an organic semiconductor microcavity with a microcavity sandwiching a doped organic semiconductor active layer, the organic semiconductor microcavity having a polaron-polariton mode and two electric contacts; and
    directing a light beam at an incident angle into the organic semiconductor microcavity in the polaron-polariton mode, thereby generating an electric current flowing between the two contacts.

15. An organic semiconductor microcavity, comprising:
    a doped organic semiconductor active layer sandwiched/embedded in a microcavity, the microcavity capable of generating an optical resonance, the doped organic semiconductor being a hole/electron transport material having a polaron absorption coefficient exceeding $10^2$ cm$^{-1}$ and capable of generating a polaron optical transition with a linewidth smaller than a predetermined threshold.

16. The organic semiconductor microcavity according to claim 15, wherein the microcavity is a Fabry-Perot cavity.

17. The organic semiconductor microcavity according to claim 15, wherein the microcavity is semi-transparent.

18. The organic semiconductor microcavity according to claim 15, wherein the hole/electron transport material has a binding energy high enough such that the polaron optical transition is observed at room temperature.

19. A polariton voltaic device, comprising:
    an organic semiconductor microcavity according to claim 15, wherein the microcavity is wedged with a thickness of the active layer varies from one side to the other.

20. A method of creating a light-matter hybrid species of charged polaritons by electrostatic gating in an organic semiconductor at room temperature, the method comprising:
    providing an organic thin film transistor with a metal gate that supports surface plasmon polaritons (SPP) or other tightly confined optical modes;
    applying negative/positive gate voltage to the metal gate thereby accumulating a large hole/electron density in the channel of the device; and
    generating charged polaron polaritons through the interaction between the holes/electrons and the SPP.

* * * * *